United States Patent [19]

Quigley

[11] Patent Number: 5,781,388
[45] Date of Patent: Jul. 14, 1998

[54] NON-BREAKDOWN TRIGGERED ELECTROSTATIC DISCHARGE PROTECTION CIRCUIT FOR AN INTEGRATED CIRCUIT AND METHOD THEREFOR

[75] Inventor: John H. Quigley, Phoenix, Ariz.

[73] Assignee: Motorola, Inc., Schaumburg, Ill.

[21] Appl. No.: 706,868

[22] Filed: Sep. 3, 1996

[51] Int. Cl.$^6$ .................................................. H02H 9/00
[52] U.S. Cl. .................................................. 361/56; 361/111
[58] Field of Search .................................... 361/56, 91, 111

[56] References Cited

U.S. PATENT DOCUMENTS

| | | | |
|---|---|---|---|
| 5,400,202 | 3/1995 | Metz et al. | 361/56 |
| 5,528,188 | 6/1996 | Au et al. | 361/56 |

*Primary Examiner*—Jeffrey A. Gaffin
*Assistant Examiner*—Sally C. Medley
*Attorney, Agent, or Firm*—Gary W. Hoshizaki; Sharon K. Coleman

[57] ABSTRACT

A non-breakdown triggered electrostatic discharge (ESD) protection circuit (11) having a voltage divider circuit and a SCR (22) protects an integrated circuit from an ESD event. The voltage divider includes a capacitor (17) and a resistor (18). The voltage divider connects to a pad of an integrated circuit and generates a trigger voltage for enabling the SCR (22) when an ESD event is applied to the pad. A worst case ESD voltage transient is used to calculate a trigger voltage for the SCR (22). The trigger voltage is selected at a voltage below where damage to the integrated circuit occurs. The SCR (22) is designed to have a turn on time constant that prevents normal signal levels from triggering the SCR (22).

16 Claims, 1 Drawing Sheet

NON-BREAKDOWN TRIGGERED ELECTROSTATIC DISCHARGE PROTECTION CIRCUIT FOR AN INTEGRATED CIRCUIT AND METHOD THEREFOR

BACKGROUND OF THE INVENTION

This invention relates, in general, to high voltage protection circuitry for an integrated circuit, and more particularly, to Electrostatic Discharge (ESD) Protection of an integrated circuit.

An integrated circuit is typically one element of a larger system comprising many circuits. Interconnection between integrated circuits takes many forms. For example, an integrated circuit is placed in a package where wire is bonded between the metal pads of the integrated circuit and leads of the package. The leads of the package typically couple to an integrated circuit board or integrated circuit socket. A high density interconnect format places solder balls on each metal pad of the integrated circuit. The integrated circuit is connected via the solder to corresponding metal pads on another substrate. In either case, the metal pads of an integrated circuit are the interface circuitry between circuitry external to the integrated circuit and circuitry internal to the integrated circuit.

It is inevitable that an integrated circuit is handled after wafer processing, during testing, packaging, and when placed in a system. Any handling of the integrated circuit exposes the device to an Electrostatic Discharge. Reliability and premature failure of an integrated circuit are a consequence of an Electrostatic Discharge (ESD). An ESD event produces extremely high voltages that can damage devices of the integrated circuit.

The pads or connection points are the pathway to circuitry internal to an integrated circuit. An Electrostatic Discharge (ESD) event applied to a pad couples a voltage typically exceeding a thousand volts to circuitry connected to the pad. The first circuit typically connected to a pad is either an Input or Output circuit. In general, an ESD event damages the Input/Output (I/O) circuitry if it is not protected by ESD circuitry. An ESD event is indiscriminate in its entry to the integrated circuit. The ESD event is coupled to any I/O circuit of the integrated circuit or between I/O circuits of the integrated circuits.

In general, ESD protection circuitry is incorporated near the pad areas of an integrated circuit. The ESD protection circuitry dissipates an ESD event before harmful voltages or currents can damage circuitry of the integrated circuit. A problem with ESD protection circuitry is the protection mechanism is not reliable over all operating conditions. Both the breakdown mechanism (due to an ESD event) of a device in the I/O circuitry and the point at which the ESD protection circuitry is enabled is an important point of consideration in the development of an ESD circuit.

Another design factor in an ESD protection circuit is the area it takes up near a pad. Most integrated circuits are pad limited due to the high density available in today's integrated circuit processes. A high density ESD protection circuit would help in reducing die area and increasing pad density.

It would be of great benefit if an ESD protection circuit could be provided that is easily manufacturable and provides protection from most ESD events that can occur on an integrated circuit.

DETAILED DESCRIPTION OF THE DRAWINGS

Figure 1:
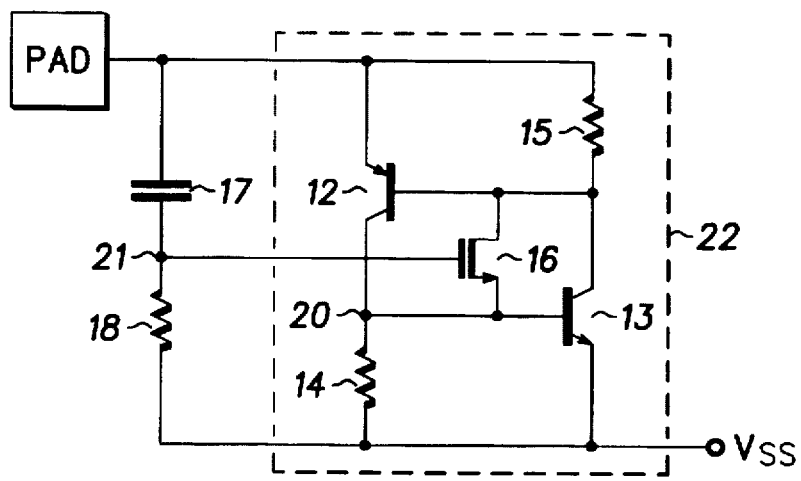
FIG. 1 is a schematic diagram of an Electrostatic Discharge (ESD) Protection circuit coupled to a pad in accordance with the present invention.

In general, an Input/Output (I/O) circuit of an integrated circuit connects to a pad. The pad is a large conductive area that also serves as a physical connecting point for a probe card (testing), wire bond, or solder ball. An integrated circuit may have hundreds or thousands of metal pads for external interconnection.

A problem with integrated circuits is that they are handled throughout the manufacturing and assembly process. An electrostatic discharge applied to any of the pads of the integrated circuit can produce substantial damage or affect reliability. The problem will remain undetected if the electrostatic discharge (ESD) event occurs after testing. Thus, a manufacturer could use the part in a system which would either not function or be unreliable in the field. This scenario is absolutely intolerable in today's manufacturing environment.

It is known that an ESD event enters through a metal pad and typically damages a device in an Input/Output circuit. Damage may also occur in the interior to the chip when the ESD event passes through the I/O circuit without being attenuated. Input/Output (I/O) circuits are typically located near the pads along the periphery of an integrated circuit for receiving and sending signals. To prevent damage to an integrated circuit, ESD protection circuitry is placed near each pad to sense and suppress the electrostatic discharge before the circuitry of an integrated circuit is damaged.

An ESD event is defined as a static discharged coupled to an integrated circuit. An ESD event is categorized in two ways, first, an ESD event can occur between any two pads of an integrated circuit, and second, an ESD event can occur between an integrated circuit and any other object.

The protection provided by ESD circuitry on an I/O circuit is typically measured using MIL-STD 883C or DOD-STD 1686A. An ESD tester provides an ESD event of a specific voltage and current waveform. The ESD tester provides an ESD event between any two pads (or groups of pads) of an integrated circuit. Thus, an ESD protection circuit must protect an integrated circuit from an ESD between any two I/O pads, an I/O pad to power supply line, or between the power supply lines.

An element that is commonly employed in preventing damage due to an ESD event is a silicon controlled rectifier (SCR). An SCR has ideal properties which make it useful as an ESD protection circuit. An SCR is enabled by a trigger voltage. An SCR rapidly turns on once the trigger voltage is applied allowing it to react quickly to prevent damage to the integrated circuit. An SCR has an extremely low impedance which effectively shorts the ESD event to prevent a damaging voltage from being applied to any circuitry.

How an SCR is triggered varies between different ESD protection circuits. For example, a prior art ESD protection circuit utilizes a Field Effect Transistor (FET) to trigger an SCR. The mechanism for generating the trigger voltage is to allow the FET to breakdown thereby coupling a voltage to the SCR. A problem with this method is that the FET would have to be scaled to insure it will breakdown before other devices on the integrated circuit. Modifying the FET to breakdown first requires additional wafer process steps adding cost and complexity to the manufacturing process. Alternately, the devices in close proximity to the pad (that are typically damaged by ESD) can be modified to have a higher breakdown voltage than the trigger FET but at a loss of performance.

FIG. 1 is a schematic diagram of an Electrostatic Discharge (ESD) protection circuit 11 coupled to a pad in accordance with the present invention. ESD protection circuit 11 does not utilize device breakdown as the trigger mechanism so it is operable each time an ESD event occurs. ESD protection circuit 11 is easily integrated on a semiconductor wafer and is small enough to be placed near a pad. ESD protection circuit 11 comprises a silicon controlled rectifier (SCR) 22, capacitor 17, and resistor 18. An electrostatic discharge applied to the pad couples through capacitor 17 and generates a voltage across resistor 18. The voltage across resistor 18 triggers SCR 22 shorting the pad to a power supply terminal Vss. SCR 22 shunts the electrostatic discharge to prevent a damaging voltage from being coupled to other circuitry coupled to the pad.

SCR 22 comprises transistors 12, 13, and 16, and resistors 14 and 15. Transistors 12 and 13 have a collector, a base, and an emitter respectively corresponding to a first electrode, a control electrode, and a second electrode. Transistors 12 is a PNP bipolar transistor. Transistor 13 is a NPN bipolar transistor. Transistor 16 has a drain, a gate, and a source respectively corresponding to a first electrode, a control electrode, and a second electrode. Transistor 16 is a Insulated Gate Field Effect Transistor (IGFET). Resistors 14 and 15 are parasitic resistances associated with the integrated version of SCR 22.

Transistor 12 has a collector connected to a node 20, a base connected to a node 19, and an emitter connected to the pad. Transistor 13 has a collector connected to node 19, a base connected to node 20, and an emitter connected to the power supply terminal Vss. Resistor 15 has a first terminal connected to the pad and a second terminal connected to node 19. Resistor 14 has a first terminal connected to node 20 and a second terminal connected to the power supply terminal Vss. Transistor 16 has a drain connected to node 19, a gate connected to a node 21, and a source connected to node 20. Capacitor 17 has a first terminal connected to the pad and a second terminal connected to node 21. Resistor 18 has a first terminal connected to node 21 and a second terminal connected to the power supply terminal Vss.

In an embodiment of ESD protection circuit 11, the circuitry connected to the pad is IGFET based circuitry. Of immediate concern is the Input/Output (I/O) circuitry typically coupled to the pad. The I/O circuitry is the first to be damaged due to its proximity to the pad. In general, damage to circuitry (for example, large output driver devices) connected to the pad is due to gate oxide breakdown. ESD protection circuit 11 is enabled before gate oxide is damaged by an ESD event. SCR 22 has an extremely low impedance that effectively discharges the energy of the ESD event without producing a voltage that could damage circuitry on the integrated circuit.

Capacitor 17 and resistor 18 form a voltage divider circuit for generating a control voltage to SCR 22 due to a transient voltage applied to the pad. Transistors 12 and 13 form a positive feedback network where collector current from transistor 12 drives the base of transistor 13 and the collector current from transistor 13 drives the base of transistor 12. Resistors 14 and 15 are parasitic resistances due to the layout of SCR 22. Typical values for resistor 14 and 15 are respectively 10 ohms and 2000 ohms. Both resistors 14 and 15 have a resistance that does not significantly effect the performance of SCR 22 and thus are not included in calculations, but one should be aware that the resistance exists and to take it into account should either resistor 14 or 15 have a high value.

Two factors relate to the operation of the voltage divider comprising capacitor 17 and resistor 18. First, SCR 22 should not trigger when normal signals are applied to the pad. Second, the voltage divider should trigger SCR 22 if an ESD event occurs at the pad. Both a normal signal and an ESD event produce a voltage transient which generates a voltage at node 21. A representation of an ESD event is needed before values of capacitor 17 and resistor 18 are calculated.

Figure 2:
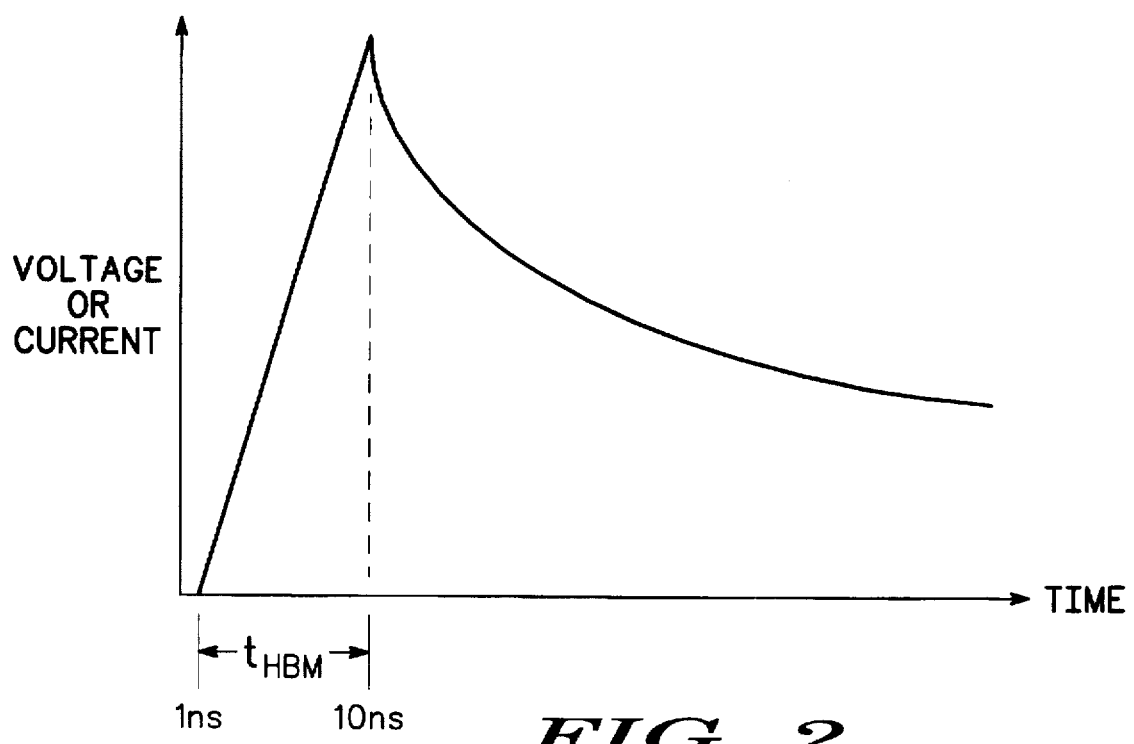
FIG. 2 is a graph of a Human Body Model ESD event.

A well known model for an electrostatic discharge is the Human Body Model (HBM). The Human Body Model represents an ESD event through a series Resistor/Inductor/Capacitor (RLC) circuit which represents a person touching one pin of an integrated circuit. The ESD event also has a common return point to complete the circuit path for the person (RLC circuit) and the integrated circuit through another pin. FIG. 2 is a graph of a Human Body Model ESD event. An HBM ESD event is characterized by a fast rising voltage or current transient which has a rise-time $t_{HBM}$ between 1 nanosecond and 10 nanoseconds. Voltage levels for an ESD event are on the order of hundreds or thousands of volts. ESD protection circuit 11 of FIG. 1 must trigger and shunt an HBM ESD event for the rise-time $t_{HBM}$ described hereinabove.

As mentioned previously, an ESD event in an IGFET based integrated circuit damages gate oxide. Empirical analysis of a gate oxide breakdown indicates that a damage occurs at a higher voltage for a voltage transient than a DC voltage. For clarity and illustration purposes it is best to use an example of a typical semiconductor wafer process to determine values for capacitor 17 and resistor 18 of ESD protection circuit 11 of FIG. 1. For example, an IGFET wafer process having gate lengths of 0.8 microns utilizes a gate oxide having a thickness of 100 angstroms. Empirical analysis has indicated that gate oxide breakdown occurs when a 10 volt DC voltage is applied across the gate oxide or a 20 volt transient voltage. Referring back to FIG. 1, ESD protection circuit 11 must enable SCR 22 before the pad reaches 20 volts because an ESD event is a transient phenomenon corresponding to the higher voltage for gate oxide breakdown.

Although gate oxide can withstand a 20 volt transient, a voltage, for example 12 volts, is selected as a trigger voltage (Vtrigger) which provides a significant margin for error in insuring ESD protection circuit 11 is enable during an ESD event. The voltage Vtrigger is a voltage at the pad. As mentioned previously, resistors 14 (10 ohms) and 15 (2000 ohms) do not have a significant impact on the design of ESD protection circuit 11 and thus are not included in the calculations.

Transistor 16 is enabled for turning on transistor 12 when a voltage at node 21 exceeds a threshold voltage of transistor 16. A typical threshold voltage for a device of this type is 0.5 volts (Vth). Capacitor 17 (C17) and resistor 18 (R18) form a voltage divider. The voltage divider under transient conditions generates a voltage at node 21 (V21) corresponding to equation 1:

$$V21 = Vtrigger*(R18/(R18+(1/\omega *C17))) \qquad (1)$$

where Vtrigger is the voltage at the pad and ω equals 2πf (f=frequency). In this example, the trigger voltage is 12 volts (v) and the voltage at node 21 at the trigger voltage is 0.5 volts (the threshold voltage of transistor 16).

An option available to a designer of ESD protection circuit 11 is selecting a value for resistor 18 and solving equation 1 for capacitor 17 or selecting a value for capacitor 17 and solving equation 1 for resistor 18. In this example, it is beneficial to integrate capacitor 17 in the layout for transistor 16. Transistor 16 is an IGFET having a polysilicon gate. An efficient method for making capacitor 17 is to form first layer metal over the polysilicon gate of transistor 16. A silicon dioxide dielectric isolates the first layer metal from the polysilicon. The first layer metal forms the top plate of capacitor 17 and the polysilicon gate forms the bottom plate of capacitor 17. For example, transistor 16 formed in the process described hereinabove would have a polysilicon gate area that would produce a capacitance of 15 femtofarads (fF) with the first layer metal. Forming capacitor 17 in this manner allows ESD protection device 11 to have the smallest possible size.

It should be noted that equation 1 has a frequency term $\omega=2\pi f$. A voltage transient is not a pure frequency. Voltage transients are commonly converted to a frequency in applications such as transmission line calculations to determine if fast rise times can be transmitted. The worst case scenario for a Human Body Model ESD event is a rise time ($t_r(esd)$) of 10 nanoseconds (ns). The 10 nanosecond rise time corresponds to the worst case energy that must be discharged by ESD protection circuit 11. Equation 2 is a rise time to frequency conversion equation for an ESD event.

$$f_{esd}=0.37/t_r(esd) \tag{2}$$

Solving equation 1 for resistor 18 and utilizing equation 2 for the frequency term yields equation 3.

$$R18=(1/(2\pi f_{esd}*C18))*(1/((Vtrigger/V21)-1)) \tag{3}$$

Plugging in the values for the variables of equation 3 ($f_{esd}$=0.37/10 ns, C18=15 fF, Vtrigger=12 v, and V21=0.5 v) yields a resistor value (R18) of 12.468 kiloohms.

The speed at which a Silicon Controlled Rectifier (SCR) triggers corresponds to a delay in shunting an ESD event. A first order approximation of a SCR time constant expression is illustrated using parameters of the 0.8 micron gate length IGFET process described hereinabove. In the example IGFET process a P-type substrate is used. P-type IGFET transistors are formed in a N-well while N-type IGFET transistors are formed in the P-type substrate.

SCR 22 comprises bipolar transistors 12 and 13. Transistor 13 is a NPN transistor formed as a lateral device. Transistor 13 comprises a N+ region as the emitter, the P-type substrate as the base, and a N-well as the collector. Both the N+ region and the N-well are formed in the P-type substrate. Transistor 12 is a PNP transistor formed as a vertical device. Transistor 12 comprises a P+ region as the emitter, the N-well is the base, and the P-type substrate is the collector. The P+ region (emitter of PNP) is formed in the N-well. Note that the N-well is the collector of the NPN transistor and the base of the PNP transistor. Similarly the P-type substrate is the collector of the PNP transistor and the base of the NPN transistor. The vertical PNP transistor is the high gain device of SCR 22. Transistor 16 pulls base current out of transistor 12 to start the positive feedback between transistors 12 and 13.

In the example process, transistor 13 is a lateral NPN transistor having a transistor base width (Wp) of 8.2 microns. The base width of transistor 13 is defined as the distance from the N-well (collector) to the N+ emitter. The base mobility µp for the NPN transistor is 150 (centimeters²/volt*second). The NPN transistor base diffusion coefficient Dp is 0.26 (volt*micron).

Transistor 12 is a vertical PNP transistor having a transistor base width (Wn) of 1.0 microns. The base width of transistor 12 is defined as the distance between the P+ emitter and the P-type substrate. The base mobility µn for the PNP transistor is 400 (centimeters²/volt*second). The PNP transistor base diffusion coefficient Dn is 0.26 (volt*micron).

The time constant $t_{NPN}$ for the NPN transistor is defined by equation 4.

$$t_{NPN}=Wp^2/(2*Dp) \tag{4}$$

Plugging in the numbers for the example process yields $t_{NPN}$ of 86.205 nanoseconds.

The time constant $t_{PNP}$ for the PNP transistor is defined by equation 5.

$$t_{PNP}=Wn^2/(2*Dn) \tag{5}$$

Plugging in the numbers for the example process yields $t_{PNP}$ of 0.481 nanoseconds. The lateral NPN transistor is significantly slower than the vertical PNP transistor as should be expected.

The first order SCR time constant $t_{SCR}$ is defined as the square root of the product of the NPN and PNP transistor time constants as shown in equation 6.

$$t_{SCR}=(t_{NPN}*t_{PNP})^{1/2} \tag{6}$$

Using the values for the time constants calculated in equations 4 and 5 yields a SCR time constant of 6.438 nanoseconds. Although the HBM ESD model may be as fast as 1 nanosecond as described hereinabove, the fact remains that other ESD protection devices such as diodes commonly placed at the pad and power busses distribute the initial transient portion of an ESD event across the entire capacitance of an integrated circuit thereby significantly slowing the transient. This allows the SCR to work under all conditions under the Human Body Model.

The time constant for SCR 22 is important because it defines the minimum voltage transient duration required to enable SCR 22. In other words, SCR 22 should not enable when normal signals are applied to the pads of an integrated circuit. Resolving equation 1 the voltage at the pad (Vtrigger) yields equation 7.

$$Vtrigger=V21*(1+(1/(R18*\omega*C17)) \tag{7}$$

In this example, the time constant for SCR 22 is placed in equation 7 for the equivalent frequency of a voltage transient. Equation 8 defines the minimum voltage transient required for SCR 22 to trigger.

$$Vtrigger=V21*(1+(t_{SCR}/(2\pi*0.37*R18*C17))) \tag{8}$$

Solving equation 8 yields a value of 7.903 volts as a minimum voltage to trigger SCR 22. Thus under normal operating conditions of an integrated circuit using this process (3 volt signal levels) it is impossible to trigger SCR 22 independent of the speed of the voltage transient.

By now it should be appreciated that an ESD protection circuit has been provided that prevents ESD damage when an ESD event is applied to a pad of an integrated circuit. The ESD protection circuit does not use a device breakdown as a trigger mechanism for an SCR. A voltage divider circuit comprising a capacitor and resistor is used to apply a voltage for enabling the SCR in an ESD event. The voltage divider circuit must trigger for a model range of an ESD event yet it must not trigger for signals applied to or provided by the integrated circuit. To achieve this criteria, the SCR is designed to trigger at a voltage significantly greater than the operating voltage of the integrated circuit based on a worst case model of a voltage transient of an ESD event. The delay time of the SCR is made sufficiently long as to prevent normal signals of the integrated circuit from triggering the SCR. Thus, a method for producing a reliable, accurate, and simple to manufacture ESD protection circuit has been provided that works over a wide range of operating conditions.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. An electrostatic discharge (ESD) protection circuit coupled to a pad of an integrated circuit comprising:

a capacitor having a first terminal coupled to the pad and a second terminal;

a resistor having a first terminal coupled to said second terminal of said capacitor and a second terminal coupled to a power supply terminal for receiving a power supply voltage, said capacitor and said resistor forming a voltage divider;

a trigger transistor having a first electrode, a control electrode coupled to the second terminal of the capacitor, and a second electrode; and a silicon controlled rectifier (SCR) having a first terminal coupled to the pad, a first control input terminal coupled to said first electrode of said trigger transistor, a second control input terminal coupled to said second electrode of said trigger transistor, and a second terminal coupled to said power supply terminal;

wherein the capacitor is formed integral with the trigger transistor and wherein the capacitor has a capacitance and the resistor has a resistance such that a voltage transient above a predetermined energy level applied to the pad triggers said SCR and a voltage transient below the predetermined energy level applied to the pad does not trigger said SCR.

2. The electrostatic discharge protection circuit as recited in claim 1 wherein said SCR comprises:

a first transistor having a first electrode coupled to said power supply terminal, a control electrode coupled to the pad and the first electrode of the trigger transistor, and a second electrode coupled to the pad; and a second transistor having a first electrode coupled to said control electrode of said first transistor, a control electrode coupled to said power supply terminal and the second electrode of the trigger transistor, and a second electrode coupled to said power supply terminal.

3. The electrostatic discharge protection circuit as recited in claim 2 wherein said SCR further includes a first resistor coupled between said second electrode of said first transistor and said control electrode of said first transistor.

4. The electrostatic discharge protection circuit as recited in claim 2 wherein said SCR further includes a second resistor coupled between said second electrode of said second transistor and said control electrode of said second transistor.

5. The electrostatic discharge protection circuit as recited in claim 1 wherein a model of an electrostatic discharge (ESD) event is provided having a worst case rise time to calculate a value for said capacitor and said resistor.

6. The electrostatic discharge protection circuit as recited in claim 5 wherein minimum energy is coupled to the pad in an ESD event having said worst case rise time.

7. The electrostatic discharge protection circuit as recited in claim 6 wherein a trigger voltage at the pad corresponds to a voltage provided by said voltage divider that enables said SCR via said trigger transistor and wherein said trigger voltage has a value less than a maximum transient voltage that damages the integrated circuit.

8. The electrostatic discharge protection circuit as recited in claim 7 wherein said voltage divider produces said voltage that enables said SCR at a frequency corresponding to said worst case rise time of said model of said electrostatic discharge event.

9. The electrostatic discharge protection circuit as recited in claim 8 wherein normal signals of the integrated circuit have a time constant less than a time constant of said SCR such that the SCR is never enabled under normal integrated circuit operating conditions.

10. A circuit for enabling a silicon controlled rectifier (SCR) to shunt an electrostatic discharge (ESD) event, the SCR being coupled between a pad of an integrated circuit and a power supply terminal, the circuit comprising:

a capacitor having a first terminal coupled to the pad and a second terminal;

a resistor having a first terminal coupled to said second terminal of said capacitor and a second terminal coupled to the power supply terminal wherein a transient voltage applied to the pad enables the SCR, said transient voltage exceeding a predetermined voltage less than a maximum transient voltage of the integrated circuit, and wherein values of said capacitor and resistor are calculated to trigger the SCR at a frequency corresponding to a worst case electrostatic discharge event; and a transistor having a first electrode coupled a first control input of the SCR, a control electrode coupled to the second terminal of the capacitor, and a second electrode coupled to a second control input of the SCR.

11. The circuit as recited in claim 10 wherein the SCR has a turn on time constant that prevents normal operating signals of the integrated circuit from triggering the SCR.

12. The circuit as recited in claim 11 wherein the worst case electrostatic discharge event corresponds to a Human Body Model electrostatic discharge event.

13. The circuit as recited in claim 12 wherein said worst case electrostatic discharge event corresponds to a condition of minimum energy transfer.

14. The circuit as recited in claim 13 wherein the SCR comprises:

a first transistor of a first conductivity type having a first electrode coupled to the power supply terminal, a control electrode coupled to the pad and the first control input terminal of the SCR, and a second electrode coupled to the pad; and a second transistor of a second conductivity type having a first electrode coupled to said control electrode of said first transistor, a control electrode coupled to the power supply terminal and the second control input terminal of the SCR, and a second electrode coupled to the power supply terminal.

15. The circuit as recited in claim 14 wherein the SCR further comprises a first resistor coupled between said second electrode of said first transistor and said control electrode of said first transistor.

16. The circuit as recited in claim 15 wherein the SCR further comprises a second resistor coupled between said second electrode of said second transistor and said control electrode of said second transistor.

* * * * *